US010985144B2

(12) United States Patent
Jingi

(10) Patent No.: US 10,985,144 B2
(45) Date of Patent: Apr. 20, 2021

(54) LIGHT EMITTING APPARATUS

(71) Applicant: TOSHIBA HOKUTO ELECTRONICS CORPORATION, Asahikawa (JP)

(72) Inventor: Tomotsugu Jingi, Asahikawa (JP)

(73) Assignee: Toshiba Hokuto Electronics Corporation, Asahikawa (JP)

(*) Notice: Subject to any disclaimer, the term of this patent is extended or adjusted under 35 U.S.C. 154(b) by 0 days.

(21) Appl. No.: 16/531,402

(22) Filed: Aug. 5, 2019

(65) Prior Publication Data
US 2020/0075558 A1 Mar. 5, 2020

(30) Foreign Application Priority Data
Sep. 3, 2018 (JP) .............................. JP2018-164637

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01)

(58) Field of Classification Search
CPC .... H01L 25/0753; H01L 33/483; H01L 33/62
See application file for complete search history.

(56) References Cited

U.S. PATENT DOCUMENTS

| | | | |
|---|---|---|---|
| 9,306,132 B2 | 4/2016 | Maki | |
| 9,627,594 B2 | 4/2017 | Maki | |
| 9,837,587 B2 | 12/2017 | Maki | |
| 2011/0101384 A1* | 5/2011 | Betsuda | ................. H05K 3/242 257/88 |
| 2016/0013376 A1 | 1/2016 | Maki | |
| 2016/0027973 A1 | 1/2016 | Maki | |
| 2016/0155913 A1 | 6/2016 | Maki | |
| 2016/0254429 A1* | 9/2016 | Fujikawa | ............... H05K 1/141 257/88 |
| 2017/0005247 A1* | 1/2017 | Maki | ................... H01L 25/0753 |

(Continued)

FOREIGN PATENT DOCUMENTS

| | | |
|---|---|---|
| JP | 2012-084855 A1 | 4/2012 |
| JP | 2015-029130 A1 | 2/2015 |

(Continued)

OTHER PUBLICATIONS

U.S. Appl. No. 16/121,930, filed Sep. 5, 2018, Jingi, Tomotsugu.

*Primary Examiner* — Allan R Wilson
(74) *Attorney, Agent, or Firm* — Burr & Brown, PLLC

(57) ABSTRACT

Disclosed is a light emitting apparatus including: first and second substrates having light transmissive property and flexibility arranged to face each other; a plurality of light emitting element groups arranged along a predetermined straight line between the first and second substrates and each of the light emitting element groups includes a first light emitting element and a second light emitting element; and a conductor pattern formed on the first substrate and including respective individual line patterns individually connected to the first and second light emitting elements and a common line pattern commonly connected to the first and second light emitting elements. The individual line patterns are routed to one side and the other side of the straight line centered on at least a part of the common line pattern.

16 Claims, 14 Drawing Sheets

(56) References Cited

U.S. PATENT DOCUMENTS

2018/0076364 A1    3/2018  Maki
2019/0101269 A1*   4/2019  Inayoshi ................. H01L 33/62

FOREIGN PATENT DOCUMENTS

| JP | 2015-073103 A1 | 4/2015 |
| JP | 2016-157979 A1 | 9/2016 |
| JP | 2016-184772 A1 | 10/2016 |

* cited by examiner

– 1 –

LIGHT EMITTING APPARATUS

CROSS-REFERENCE TO RELATED APPLICATIONS

This application is based upon and claims the benefit of priority from the prior Japanese Patent Application No. 2018-164637 filed in Japan on Sep. 3, 2018; the entire contents of which are incorporated herein by reference.

FIELD

Embodiments of this disclosure generally relate to a light emitting apparatus.

BACKGROUND

In recent years, emphasis has been placed on efforts to reduce energy consumption. From such a background, light emitting diodes (LEDs) are attracting attention as a next-generation light source due to having relatively low power consumption. LEDs have a small size, generate less heat, and have excellent responsiveness. For this reason, LEDs are widely used in various optical devices. For example, a light emitting apparatus has recently been proposed, in which LEDs arranged on a substrate having flexibility and light transmissive property are used as a light source. In such types of light emitting apparatus, finding a method of supplying power to LEDs is an issue.

In particular, in a light emitting apparatus having a plurality of LEDs as a light source, wiring on the substrate where the LEDs are mounted is limited from the viewpoint of securing transmissive property.

DETAILED DESCRIPTION

According to an aspect of this disclosure, there is provided a light emitting apparatus including: first and second substrates having light transmissive property and flexibility arranged to face each other; a plurality of light emitting element groups arranged along a predetermined straight line between the first and second substrates and each of the light emitting element groups includes a first light emitting element emitting a first color and a second light emitting element emitting a second color; and a conductor pattern formed on the first substrate and including respective individual line patterns individually connected to the first and second light emitting elements and a common line pattern commonly connected to the first and second light emitting elements. The individual line patterns are routed to one side and the other side of the straight line centered on at least a part of the common line pattern.

An embodiment of this disclosure will now be described with reference to the accompanying drawings. The following description will be made on the basis of an XYZ coordinate system consisting of an X-axis, a Y-axis, and a Z-axis perpendicular to each other.

Figure 1:
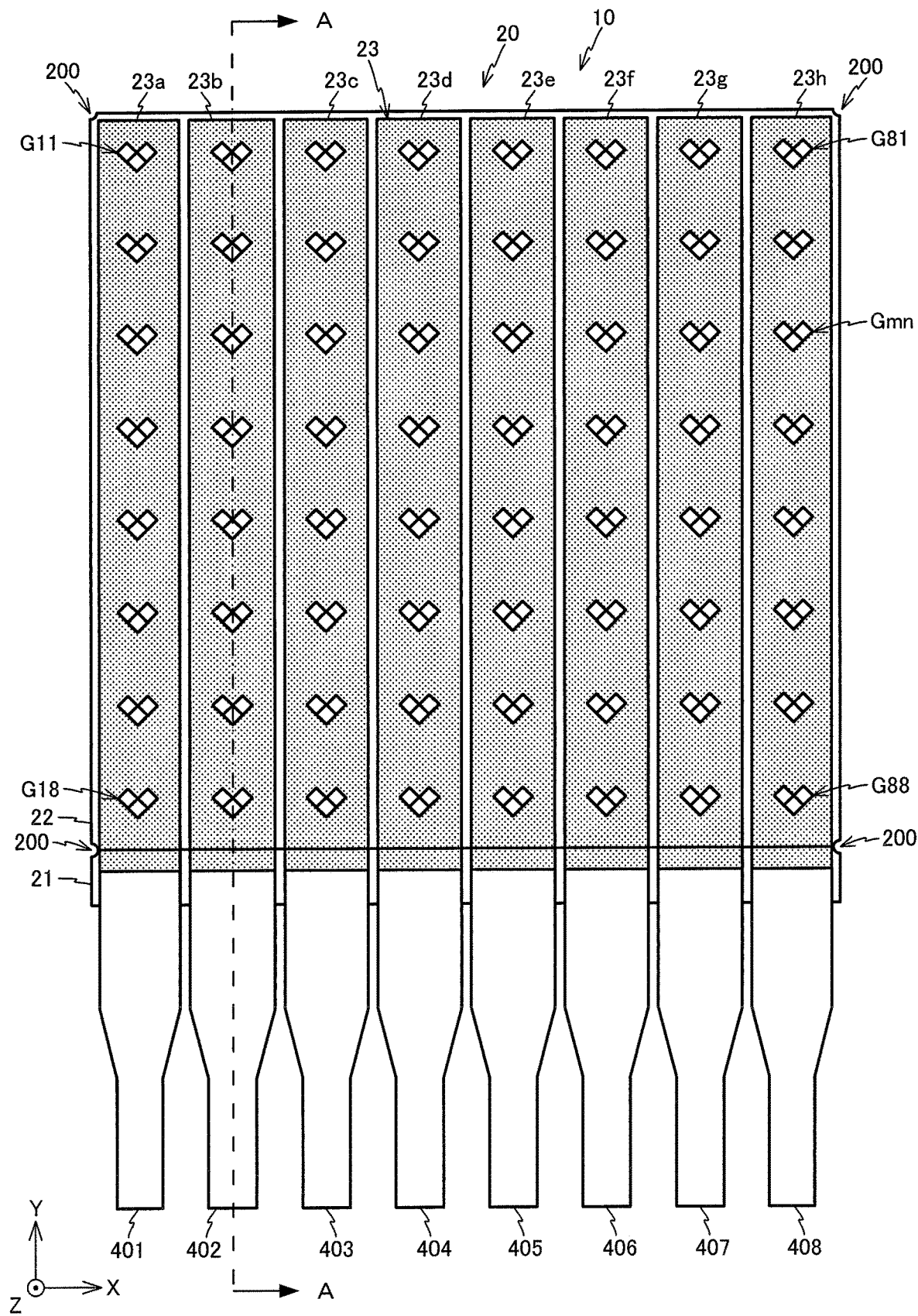
FIG. 1 is a plan view illustrating a light emitting apparatus according to an embodiment of this disclosure.

FIG. 1 is a plan view illustrating a light emitting apparatus 10 according to an embodiment of this disclosure. As illustrated in FIG. 1, the light emitting apparatus 10 is a module with a longitudinal direction set to the Y-axis direction. This light emitting apparatus 10 has a square light emitting panel 20 and eight flexible cables 401 to 408 connected to the light emitting panel 20.

Figure 2:
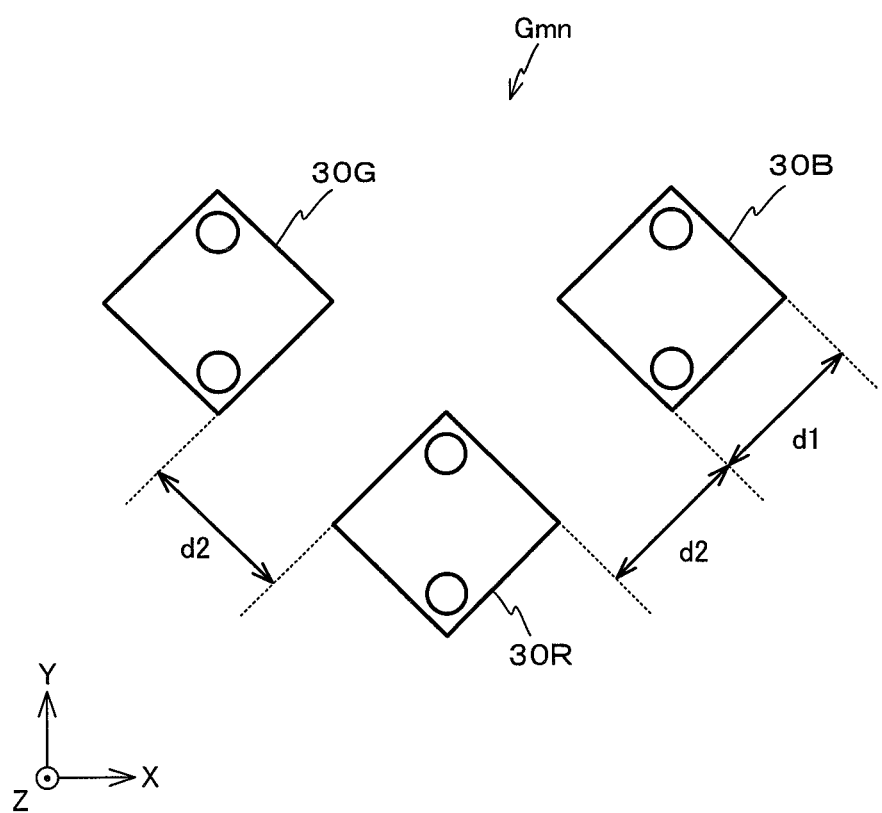
FIG. 2 is a plan view illustrating a light emitting element group.

The light emitting panel 20 is a panel having sixty-four light emitting element groups Gmn (=G11 to G88, where "m", and "n" denote integers 1 to 8) arranged in a matrix shape of eight rows and eight columns as a light source. The light emitting panel 20 has a dimension of 10 to 15 cm in the X-axis direction and the Y-axis direction. FIG. 2 is a plan view illustrating the light emitting element group Gmn. As illustrated in FIG. 2, the light emitting element group Gmn has three light emitting elements 30R, 30G, and 30B.

Each of the light emitting elements 30R, 30G, and 30B is a square LED chip having a length of approximately 0.1 to 3 mm in one side. According to this embodiment, the light emitting elements 30R, 30G, and 30B are bare chips. In the following description, for convenience purposes, the light emitting elements 30R, 30G, and 30B are collectively called a light emitting element 30.

Figure 3:
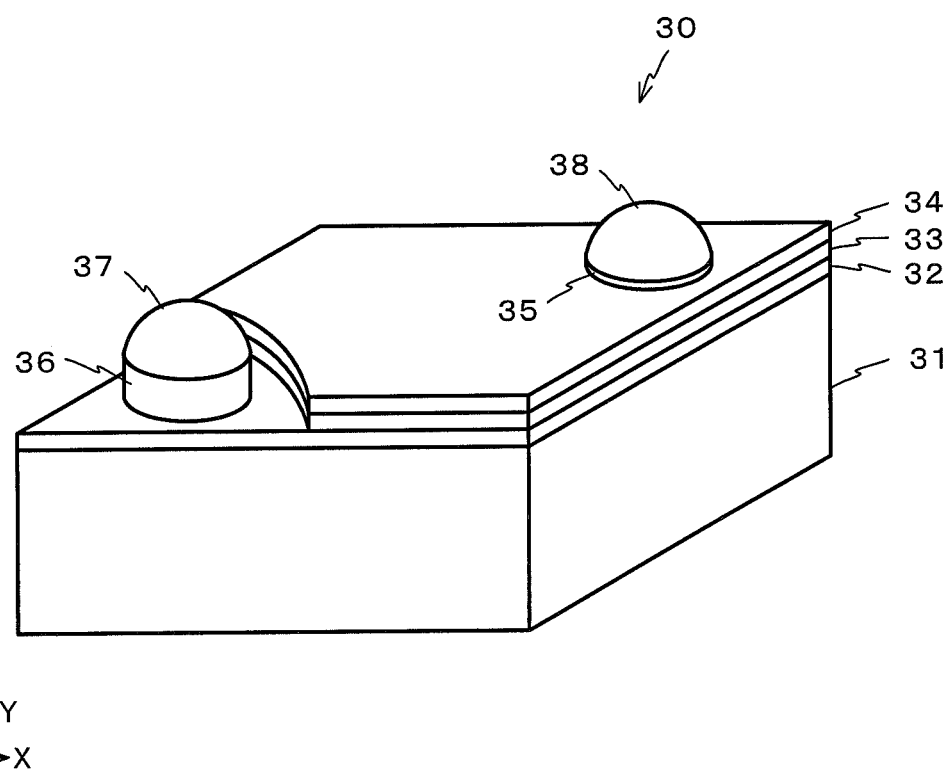
FIG. 3 is a perspective view illustrating an exemplary light emitting element.

FIG. 3 is a perspective view illustrating an exemplary light emitting element 30. As illustrated in FIG. 3, the light emitting element 30 is a LED chip including a base substrate 31, an N-type semiconductor layer 32, an active layer 33, and a P-type semiconductor layer 34. A rated voltage of the light emitting element 30 is set to approximately 2.5 V.

The base substrate 31 is a square plate-shaped substrate formed of, for example, sapphire. An N-type semiconductor layer 32 having the same shape as that of the base substrate 31 is formed on an upper surface of the base substrate 31. In addition, an active layer 33 and a P-type semiconductor layer 34 are laminated sequentially on an upper surface of the N-type semiconductor layer 32. The N-type semiconductor layer 32, the active layer 33, and the P-type semiconductor layer 34 are formed of a compound semiconductor material. For example, an InAlGaP-based semiconductor may be employed in the active layer of the light emitting element emitting red light. In addition, as a light emitting element emitting blue or green light, a GaN-based semiconductor may be employed in the P-type semiconductor layer 34 or the N-type semiconductor layer 32, and an InGaN-based semiconductor may be employed in the active layer 33. In either case, the active layer may have a double hetero (DH) junction structure or a multiple quantum well (MQW) structure. In addition, a PN junction configuration may also be employed.

The active layer 33 and the P-type semiconductor layer 34 laminated on the N-type semiconductor layer 32 are notched in a corner portion of the −Y side and the −X side. A surface of the N-type semiconductor layer 32 is exposed from the notch of the active layer 33 and the notch of the P-type semiconductor layer 34.

In a portion of the N-type semiconductor layer 32 exposed from the active layer 33 and the p-type semiconductor layer 34, a pad electrode 36 electrically connected to the N-type semiconductor layer 32 is provided. In addition, in a corner portion between the +X side and the +Y side of the P-type semiconductor layer 34, a pad electrode 35 electrically connected to the P-type semiconductor layer 34 is provided. The pad electrodes 35 and 36 are formed of copper (Cu) or gold (Au), and bumps 37 and 38 are provided on upper surfaces thereof. The bumps 37 and 38 are metal bumps formed of metal such as gold (Au) or gold alloy. Instead of a metal bump, a solder bump formed in a hemispherical shape may also be employed. In the light emitting element 30, the bump 37 serves as a cathode, and the bump 38 serves as an anode.

The light emitting element 30R of FIG. 2 emits red light. In addition, the light emitting element 30G emits green light, and the light emitting element 30B emits blue light. Specifically, the light emitting element 30R emits light at a peak wavelength of approximately 600 to 700 nm. In addition, the light emitting element 30G emits light at a peak wavelength of approximately 500 to 550 nm. The light emitting element 30B emits light at a peak wavelength of approximately 450 to 500 nm.

The light emitting elements 30R, 30G, and 30B configured as described above are arranged such that the light emitting elements 30G and 30B are disposed adjacent to the light emitting element 30R. In addition, light emitting elements 30R, 30G, and 30B are arranged closely such that a distance d2 between the neighboring light emitting elements 30R, 30G, and 30B is equal to or shorter than a width d1 of the light emitting elements 30R, 30G, and 30B.

Figure 4:
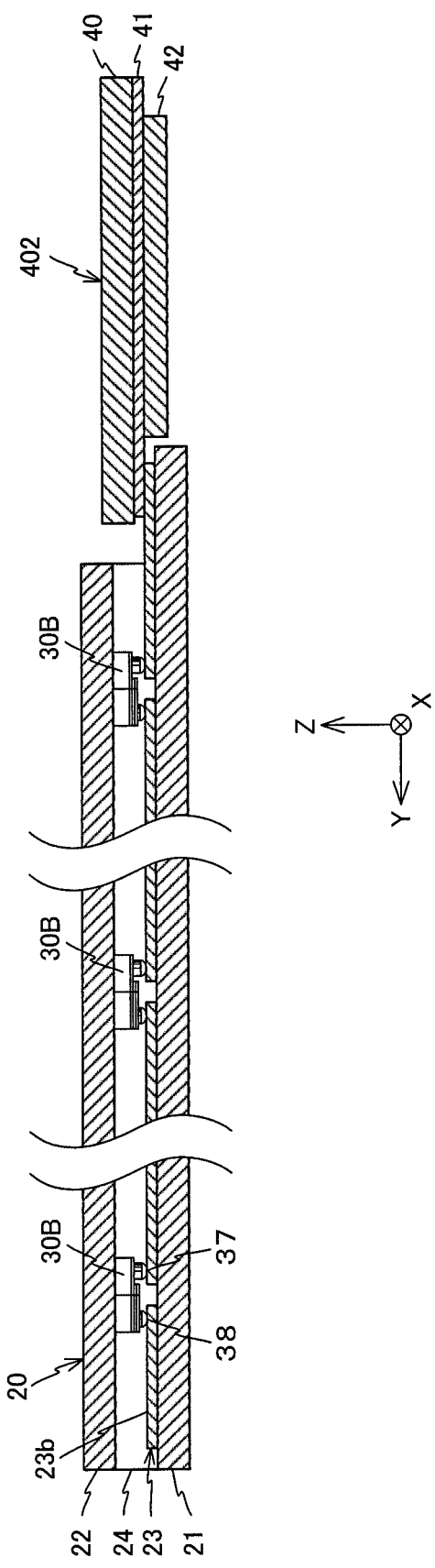
FIG. 4 is a cross-sectional view taken along a line A-A of the light emitting apparatus.

FIG. 4 is a diagram illustrating a cross section A-A of the light emitting apparatus 10 of FIG. 1. As recognized from FIG. 4, the light emitting panel 20 of the light emitting apparatus 10 has the light emitting elements 30R, 30G, and 30B described above, a set of substrates 21 and 22, and a resin layer 24 interposed between the substrates 21 and 22. Note that FIG. 4 illustrates only the light emitting element 30B.

The substrate 21 is a film-like member with a longitudinal direction set in the Y-axis direction. In addition, the substrate 22 is a square film-like member. The substrates 21 and 22 have a thickness of approximately 50 to 300 m, and transmit visible light. The substrates 21 and 22 preferably have a total light ray transmittance of approximately 5 to 95%. Note that the total light ray transmittance refers to a total light transmittance measured on the basis of Japanese Industrial Standard JISK7375:2008.

The substrates 21 and 22 have flexibility and a flexural modulus of approximately 0 to 320 kgf/mm² (except for zero). Note that the flexural modulus is a value measured by a method based on ISO178 (JISK7171:2008).

The substrates 21 and 22 may be formed of polyethylene terephthalate (PET), polyethylene naphthalate (PEN), polycarbonate (PC), polyethylene succinate (PES), ARTON, acrylic resin, or other similar materials.

Out of a set of the substrates 21 and 22, a conductor layer 23 having a thickness of approximately 0.05 to 10 µm is formed on the upper surface of the substrate 21. The conductor layer 23 is, for example, a deposited film or a sputtered film. In addition, the conductor layer 23 may be formed by bonding a metal film with an adhesive. In a case where the conductor layer 23 is a deposited film or a sputtered film, the conductor layer 23 has a thickness of approximately 0.05 to 2 µm. If the conductor layer 23 is formed by bonding a metal film, the conductor layer 23 has a thickness of approximately 2 to 10 µm, or 2 to 7 µm.

Figure 5:
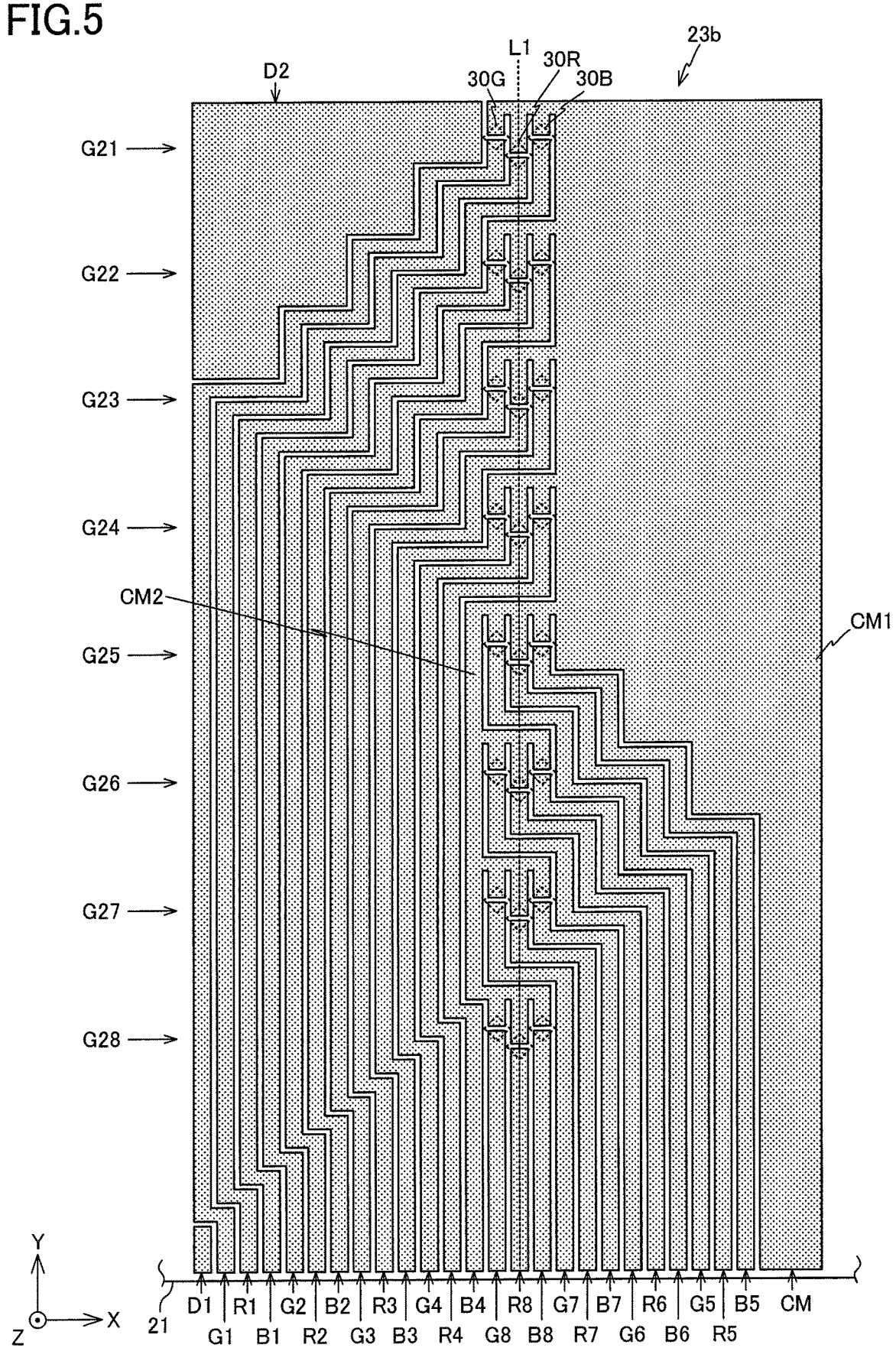
FIG. 5 is a plan view illustrating a conductor pattern.

The conductor layer 23 is a metal layer formed of a metal material such as copper (Cu) or silver (Ag). As illustrated in FIG. 1, the conductor layer 23 has eight conductor patterns 23a to 23h with longitudinal directions set in the Y-axis direction. FIG. 5 is a plan view illustrating the conductor pattern 23b of FIG. 4. As illustrated in FIG. 5, the conductor pattern 23b has twenty-four individual line patterns G1 to G8, R1 to R8, and B1 to B8, a common line pattern CM, and a pair of dummy line patterns D1 and D2.

Each of the individual line patterns G1 to G8 has one end connected to the cathode of the respective light emitting element 30G of the respective light emitting element group G21 to G28. In addition, the other end is routed to −Y-side end of the substrate 21. Similarly, each of the individual line patterns R1 to R8 has one end connected to the cathode of the respective light emitting element 30R of the respective light emitting element group G21 to G28. In addition, the other end is routed to the −Y-side end of the substrate 21. Furthermore, each of the individual line patterns B1 to B8 has one end connected to the cathode of the respective light emitting element 30B of the respective light emitting element group G21 to G28. In addition, the other end is routed to the −Y-side end of the substrate 21.

One end of the common line pattern CM is divided into a plurality of branches, and each branch is connected to the anode of the respectively light emitting element 30R, 30G, and 30B of the respective light emitting element group G21 to G28. In addition, the other end is routed to the −Y-side end of the substrate 21. The common line pattern CM generally includes a wide main part CM1 located in the +X side of the individual line pattern B5 and a branched part CM2 branched from the main part CM1.

In the conductor pattern 23b, the light emitting element groups G21 to G28 arranged along a straight line L1 in parallel to the Y-axis are respectively connected to the individual line patterns G1 to G8, R1 to R8, and B1 to B8, the individual line patterns G1 to G4, R1 to R4, and B1 to B4 are routed to the −X-side of the straight line L1, and the individual line patterns G5 to G8, R5 to R8, and B5 to B8 are routed to the +X-side of the straight line L1. In addition, the branched parts CM2 are interposed between the individual line patterns G1 to G4, R1 to R4, and B1 to B4 and the individual line patterns G5 to G8, R5 to R8, and B5 to B8.

The dummy line patterns D1 and D2 are formed in a region where no individual line patterns and no common line patterns are provided.

Figure 6:
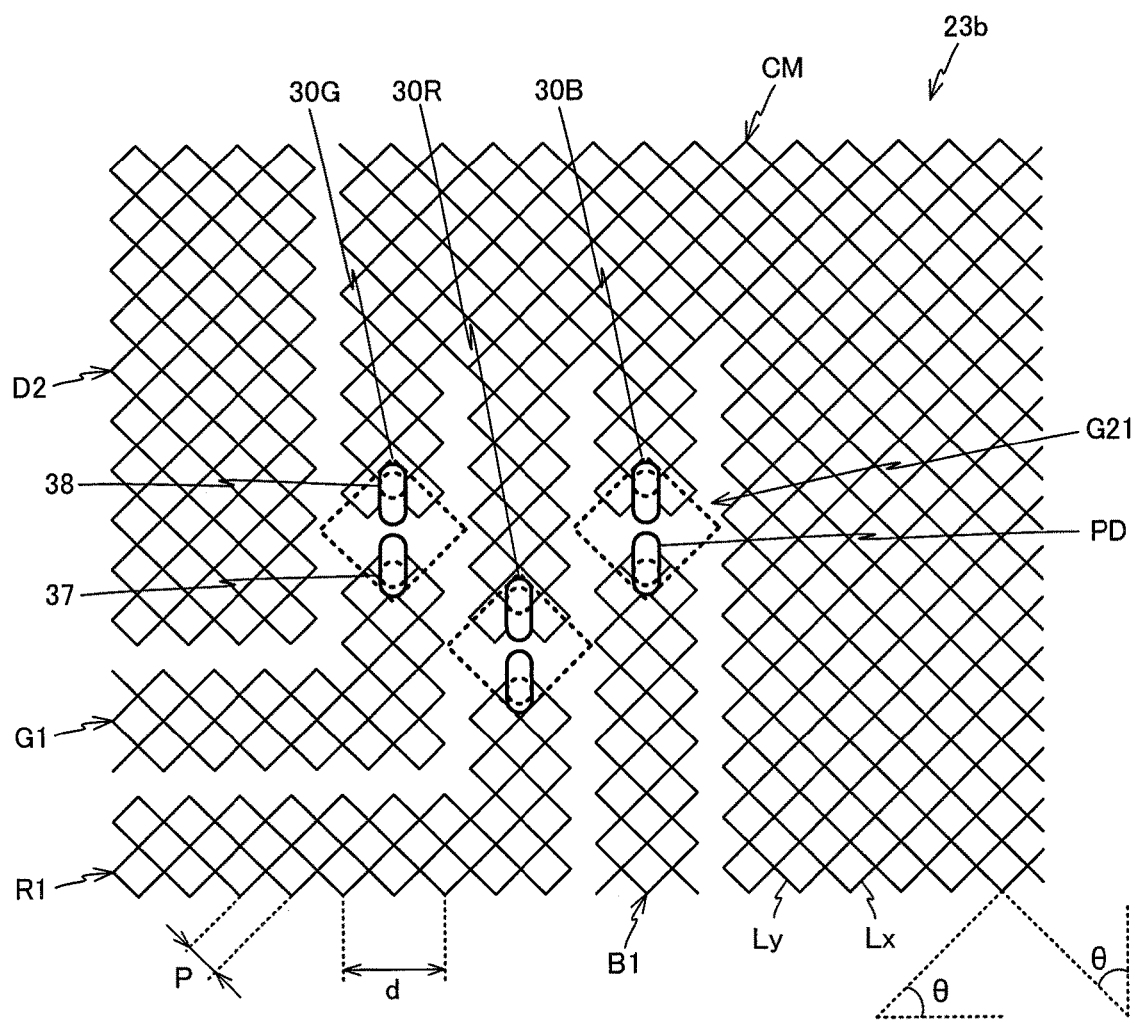
FIG. 6 is an enlarged view illustrating the vicinity of the light emitting element group.

The individual line patterns G1 to G8, R1 to R8, and B1 to B8, the common line pattern CM, and the dummy line patterns D1 and D2 consist of a mesh pattern. FIG. 6 is an enlarged view illustrating the vicinity of the light emitting element group G21. As recognized from FIG. 6, the individual line patterns G1, R1, and B1, the common line pattern CM, and the dummy line pattern D2 include a line Lx with an angle of 45° relative to the X-axis and a line Ly with an angle of 45° relative to the Y-axis.

The lines Lx and Ly have a line width of approximately 5 μm. In addition, the lines Lx and Ly have an array pitch P of approximately 150 μm. The individual line patterns G1, R1, and B1 and the common line pattern CM have connecting pads PD where the bumps 37 and 38 of the light emitting elements 30R, 30G, and 30B are connected. The light emitting elements 30R, 30G, and 30B are electrically connected to the individual line patterns G1, R1, and B1 and the common line pattern CM as the bumps 37 and 38 are connected to the connecting pad PD.

Similar to the conductor pattern 23b described above, the conductor patterns 23a and 23c to 23h of FIG. 1 include twenty-four individual line patterns G1 to G8, R1 to R8, and B1 to B8, a common line pattern CM, and two dummy line patterns D1 and D2.

Returning to FIG. 4, the resin layer 24 is an insulator formed between the substrates 21 and 22. The resin layer 24 is formed of, for example, epoxy-based thermosetting resin having light transmittance. The resin layer 24 preferably has, for example, a pre-curing minimum melt velocity VC1 of 10 to 10000 Pa·s within a temperature range of 80 to 160° C. In addition, it is preferable that the melt viscosity change rate VR until reaching a temperature T1 (most softening temperature) in the pre-curing minimum melt viscosity VC1 is set to $1/1000$ or lower. Furthermore, the resin layer 24 preferably has a Vicat softening temperature T2 of 80 to 160° C. after reaching the minimum melt viscosity through heating, that is, after the curing, and a tensile storage elastic modulus EM within a temperature range of 0 to 100° C. is preferably 0.01 to 1000 GPa. Furthermore, the resin layer 24 preferably has a glass transition temperature T3 of 100 to 160° C.

The melt viscosity is a value obtained by changing a temperature of a measurement target to 50° C. to 180° C. based on the method described in JIS K7233. The Vicat softening temperature is a value obtained by setting a test load of 10 N and a temperature increase rate of 50° C./hour based on the A50 method described in JIS K7206(ISO 306: 2004). The glass transition temperature and the melting temperature are values obtained by differential scanning calorimetry based on the method in compliance with JIS K7121 (ISO 3146). The tensile storage elastic modulus is a value obtained based on the method in compliance with JIS K7244-1 (ISO 6721). Specifically, the tensile storage elastic modulus is a value obtained by sampling a measurement target increasing in temperature at an equal rate per 1° C. for one minute from −100° C. to 200° C. at a frequency of 10 Hz using a dynamic viscoelasticity auto meter.

In the light emitting panel 20 configured as described above, as illustrated in FIG. 4, a Y-axis direction length of the substrate 22 is shorter than that of the substrate 21. For this reason, the −Y-side end of the conductor layer 23 is in an exposed state.

The flexible cable 402 is a flexible wiring substrate with a longitudinal direction set in the Y-axis direction. As illustrated in FIG. 1, the flexible cable 402 is formed in a tapered shape such that its width (dimension of the X-axis direction) is reduced from the +Y-side end to the −Y-side end.

As illustrated in FIG. 4, the flexible cable 402 has an base substrate 40 having insulation and flexibility and made of, for example, polyimide, a conductor pattern 41 connected to the conductor layer 23 of the light emitting panel 20, and a cover layer 42 that covers the conductor pattern 41. In the conductor pattern 41 covered by the conductor layer 42, only both ends of the Y-axis direction are exposed. The conductor pattern 41 includes a plurality of lines. These lines will be described below.

As illustrated in FIG. 4, the lower surface of the +Y-side of the base substrate 40 of the flexible cable 402 is bonded to the upper surface of −Y-side end of the substrate 21 of the light emitting panel 20 using an anisotropic conductive adhesive. As illustrated in FIG. 1, the flexible cable 402 is bonded to the light emitting panel 20 such that the conductor pattern 23b of the light emitting panel 20 and the flexible cable 402 overlap with each other.

Figure 7:
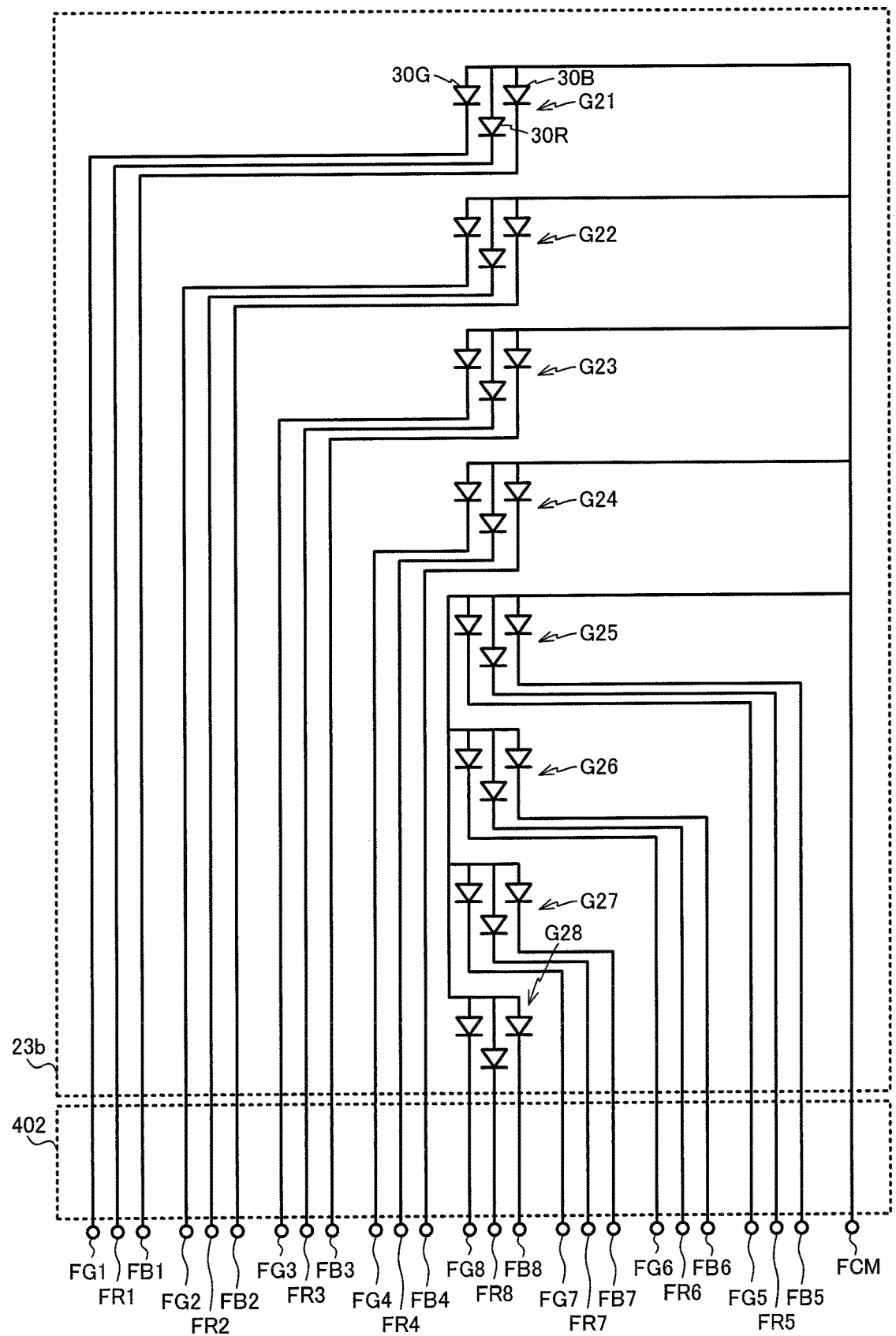
FIG. 7 is a diagram illustrating a circuit formed by bonding a flexible cable to a light emitting panel.

FIG. 7 is a diagram illustrating a circuit formed by bonding the flexible cable 402 to the light emitting panel 20. As illustrated in FIG. 7, the flexible cable 402 includes twenty-five lines FG1 to FG8, FR1 to FR8, FB1 to FB8, and FCM. The lines FG1 to FG8, FR1 to FR8, and FB1 to FB8 of the flexible cable 402 are respectively connected to the cathodes of the light emitting elements 30G, 30R, and 30B of the light emitting element groups G21 to G28. In addition, the line FCM of the flexible cable 402 is connected to all of the anodes of the light emitting elements 30G, 30R, and 30B of the light emitting element groups G21 to G28.

The flexible cables 401 and 403 to 408 also have configurations similar to that of the flexible cable 402 described above. As illustrated in FIG. 1, each of the flexible cables 401 and 403 to 408 is bonded to the light emitting panel 20 such that the conductor patterns 23a and 23c to 23h of the light emitting panel 20 and the flexible cables 401 and 403 to 408 overlap with each other.

In the light emitting apparatus 10 configured as described above, it is possible to individually turn on the light emitting elements 30R, 30G, and 30B of the light emitting element group Gmn by selectively applying voltages to the lines FG1 to FG8, FR1 to FR8, and FB1 to FB8 of the flexible cables 401 to 408 and the line FCM.

Figure 8:
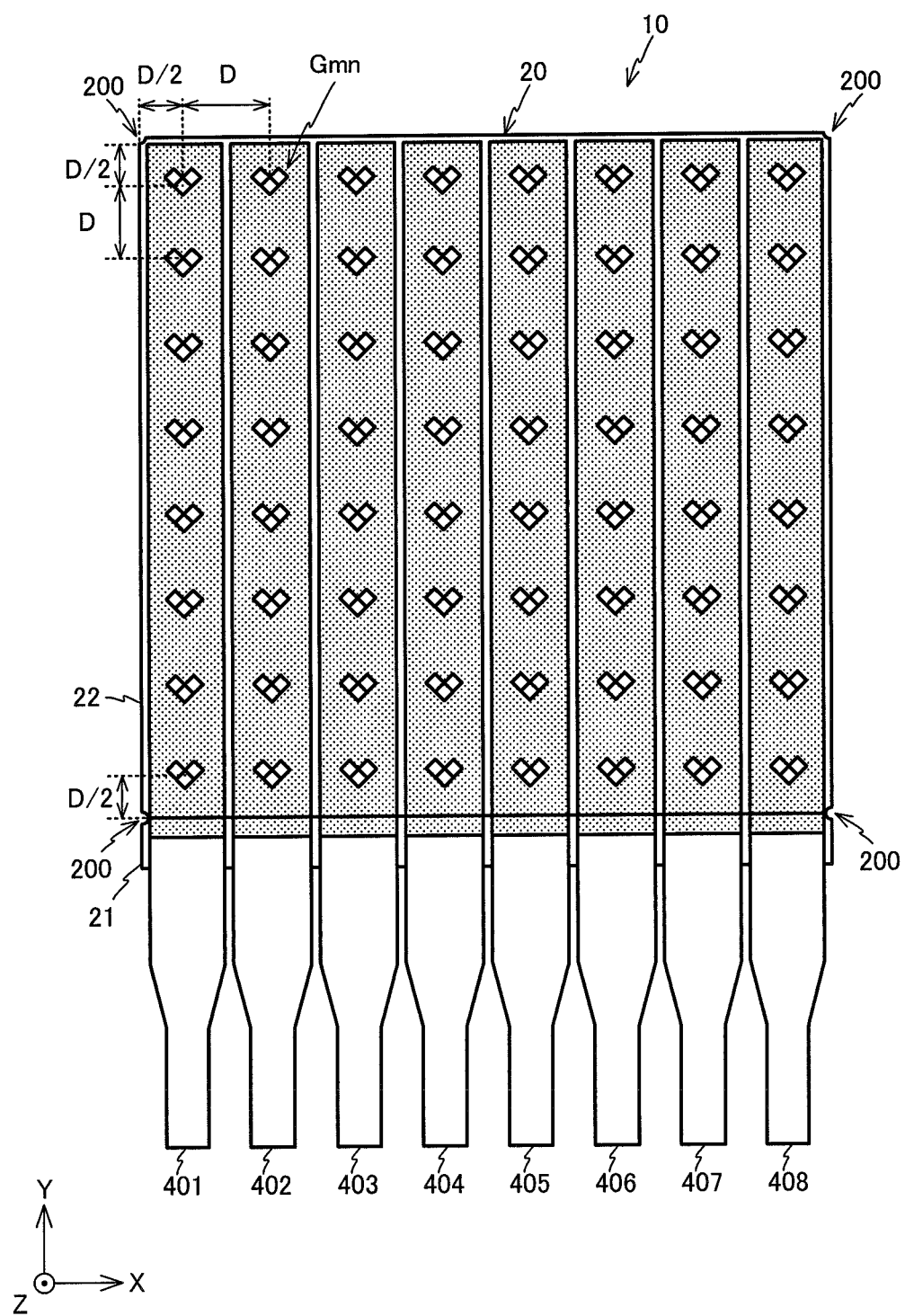
FIG. 8 is a diagram illustrating an array of the light emitting element group.

FIG. 8 is a diagram illustrating an array of the light emitting element group Gmn. As illustrated in FIG. 8, the light emitting apparatus 10 has a circular notch 200 provided in a corner portion of the substrate 22. In addition, each light emitting element group Gmn is arranged such that array pitches of the X-axis direction and the Y-axis direction are set to "D", and the distance from the outer edge of the substrate 22 of the light emitting panel 20 to the closest light emitting element group Gmn is set to "D/2".

Figure 9:
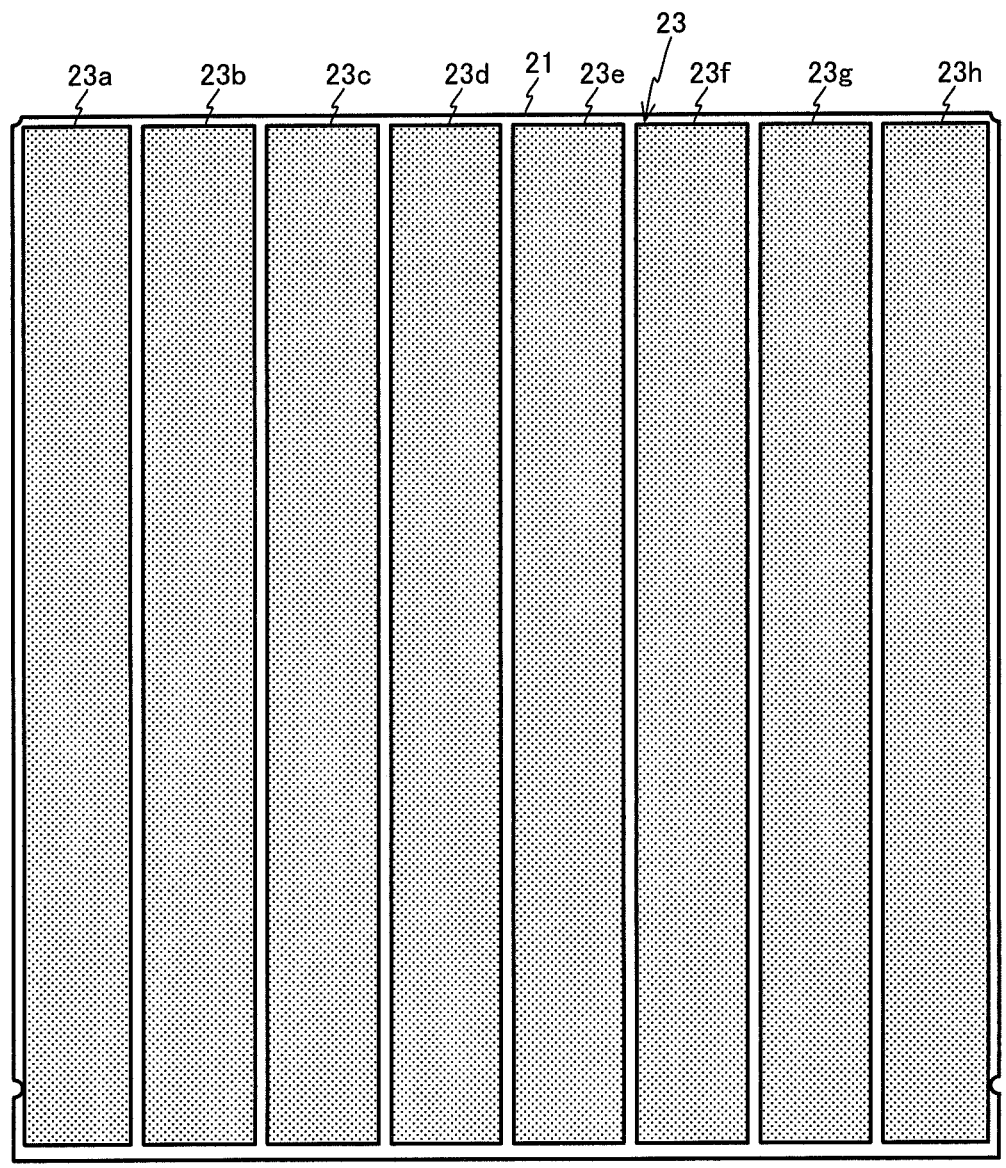
FIG. 9 is a diagram for describing a fabrication sequence of the light emitting apparatus.

Next, a method of fabricating the aforementioned light emitting apparatus 10 will be described. As illustrated in FIG. 9, first, a substrate 21 formed of PET is prepared. Following that, conductor patterns 23a to 23h including twenty-four individual line patterns G1 to G8, R1 to R8, and B1 to B8, a common line pattern CM, a pair of dummy line patterns D1 and D2, and connecting pads PD are formed on the entire surface of the substrate 21. As an exemplary method of forming the conductor patterns 23a to 23h, a subtract method, an additive method, or other similar methods may be employed.

Figure 10:
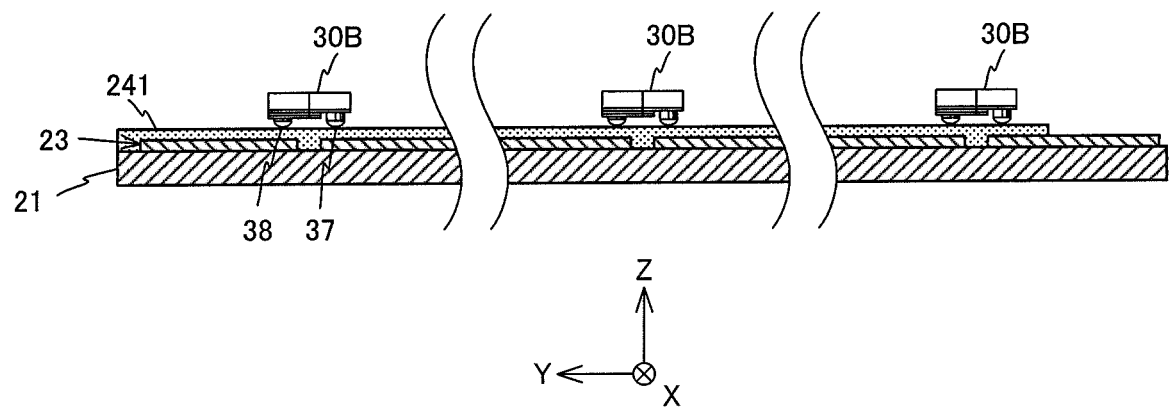
FIG. 10 is a diagram for describing a fabrication sequence of the light emitting apparatus.

Then, as illustrated in FIG. 10, a resin sheet 241 having a thermosetting property is prepared on a surface of the substrate 21 having conductor patterns 23a to 23h. The thickness of this resin sheet 241 is nearly equal to the height of the bump 37 or 38 of the light emitting element 30. The resin sheet 241 is formed of, for example, epoxy-based resin.

Then, the light emitting element 30R, 30G, and 30B are placed on the resin sheet 241. In this case, the light emitting elements 30R, 30G, and 30B are positioned such that the connecting pads PD of the conductor patterns 23a to 23h are located directly under the bumps 37 and 38 of the light emitting element 30.

Figure 11:
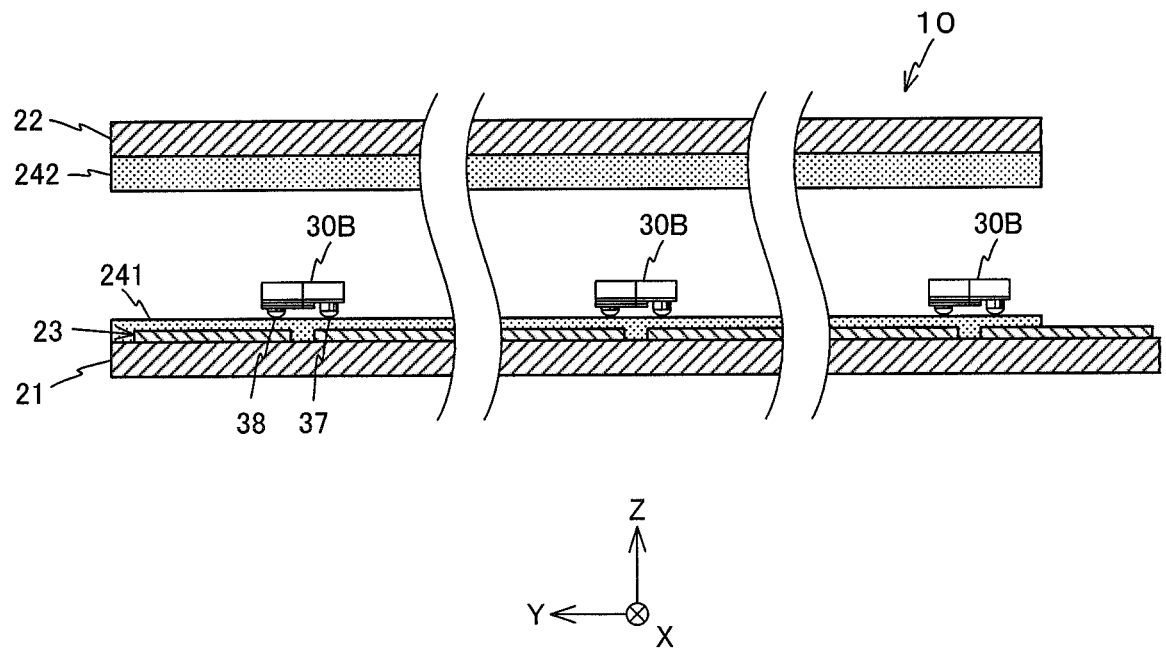
FIG. 11 is a diagram for describing a fabrication sequence of the light emitting apparatus.

Then, as illustrated in FIG. 11, the substrate 22 which has an underlying resin sheet 242 with a thermosetting property on its lower surface is placed on the upper surface side of the substrate 21. The resin sheet 242 has the same property as that of the resin sheet 241.

Then, each of the substrates 21 and 22 is heated and pressure bonded in a vacuum atmosphere. As a result, first, the bumps 37 and 38 formed on the light emitting element 30 penetrate the resin sheet 241 and are electrically connected to each of the conductor patterns 23a to 23h on the conductor layer 23. In addition, the resin sheets 241 and 242, softened through heating, are filled around the light emitting element 30 without leaving a gap.

Then, the resin sheets 241 and 242 are cured. As a result, as illustrated in FIG. 4, the resin sheets 241 and 242 serve as a resin layer 24 that holds the light emitting elements 30R, 30G, and 30B between the substrates 21 and 22. The light emitting panel 20 is thus completed.

Figure 12:
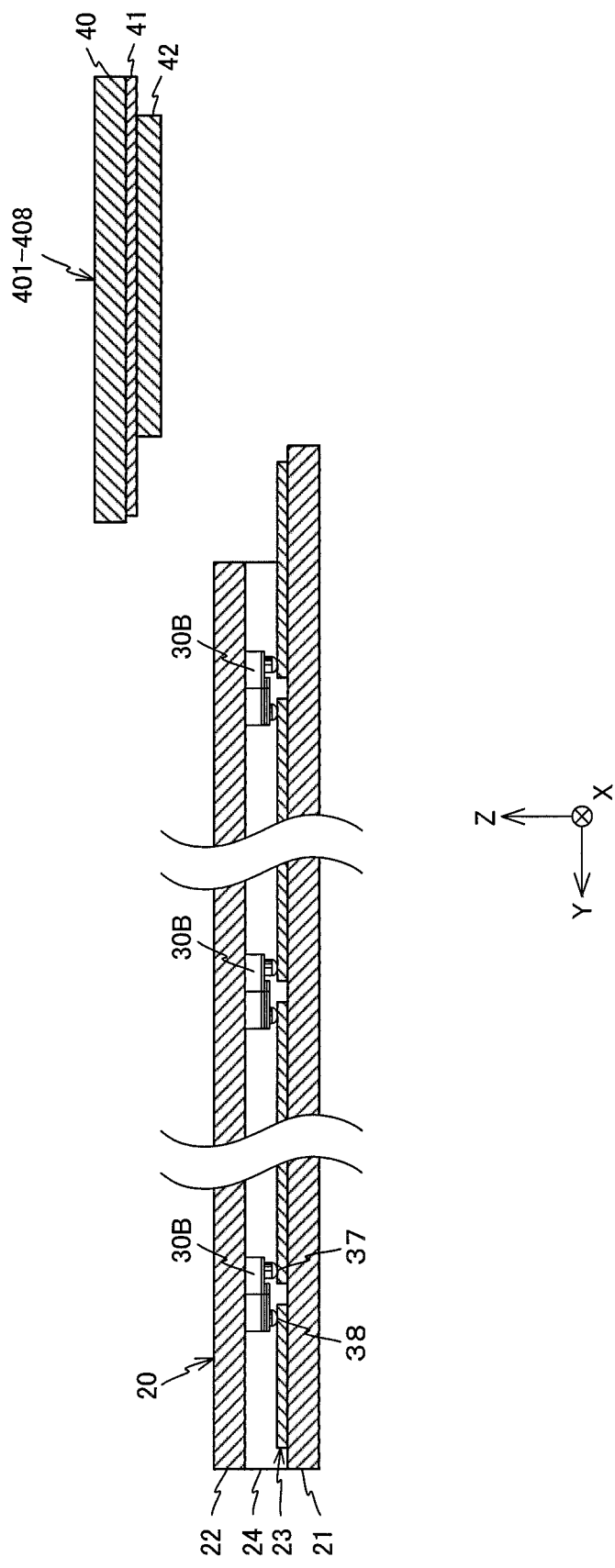
FIG. 12 is a diagram for describing a fabrication sequence of the light emitting apparatus.

Then, as illustrated in FIG. 12, the flexible cables 401 to 408 are bonded to the light emitting panel 20 using an anisotropic conductive adhesive. Through the aforementioned process, the light emitting apparatus 10 of FIG. 1 is completed.

The light emitting apparatus 10 configured as described above is connected to a power circuit (not shown). By selectively applying voltages to the lines FG1 to FG8, FR1 to FR8, and FB1 to FB8 and the line FCM of the flexible cables 401 to 408 using the power circuit, the light emitting elements 30R, 30G, and 30B of the light emitting element group Gmn are individually turned on.

As described above, according to this embodiment, as illustrated in FIG. 5 in each conductor pattern 23a to 23h, the twenty-four individual line patterns G1 to G8, R1 to R8, and B1 to B8 connected to the light emitting elements 30R, 30G, and 30B of the light emitting element group Gmn are routed to the −X-side and the +X-side of the straight line L1 passing through the light emitting element group Gmn. And the twenty-four individual line patterns G1 to G8, R1 to R8, and B1 to B8 are routed to the −X-side and the +X-side of the branched part CM2 branched from the common line pattern CM. As a result, it is possible to densely arrange the light emitting element groups Gmn. In addition, the twenty-four individual line patterns G1 to G8, R1 to R8, and B1 to B8, the common line pattern CM, and the pair of dummy line patterns D1 and D2 do not overlap with each other. Therefore, it is possible to implement wiring for each light emitting element while securing light transmittance of the substrates 21 and 22.

According to this embodiment, in each conductor pattern 23a to 23h, the common line patterns CM that link the neighboring light emitting element groups Gmn have the same length. As such, the calculation of the electric current flowing through the common line pattern CM of the light emitting element group Gmn is simplified. This allows the possibility for more freedom in regard to the design.

According to this embodiment, the eight light emitting element groups Gmn are arranged in different conductor patterns 23a to 23h. As a result, it is possible to facilitate the wiring design compared to a case where the conductor patterns 23a to 23h are commonalized.

Figure 13:
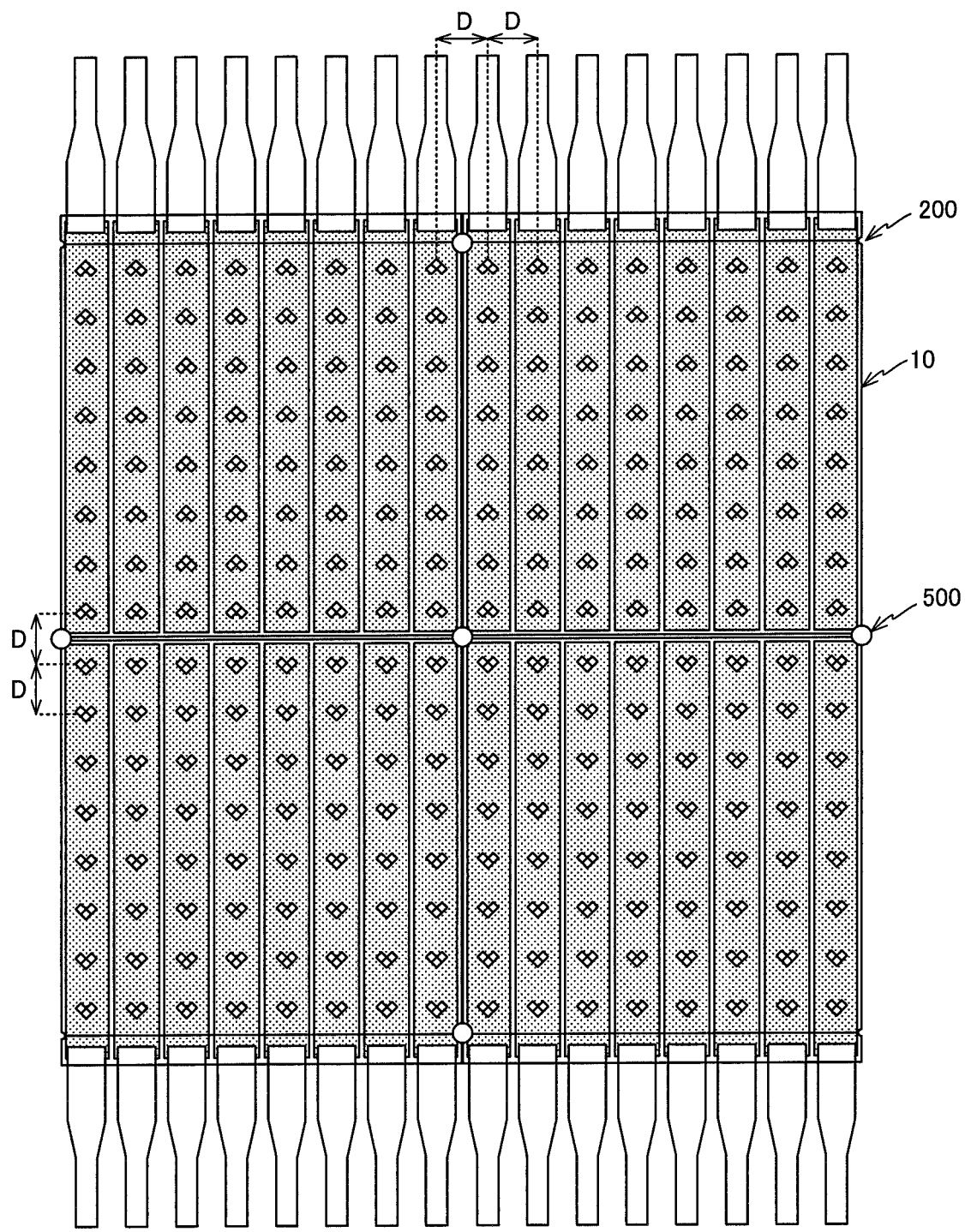
FIG. 13 is a diagram for describing a mode of use of the light emitting apparatus.

In the light emitting panel 20 according to this embodiment, as illustrated in FIG. 8, each light emitting element group Gmn is arranged such that the array pitches of the X-axis direction and the Y-axis direction are set to "D", and the distance from the outer edge of the substrate 22 of the light emitting panel 20 to the closest light emitting element group Gm is set to "D/2". Therefore, for example, as illustrated in FIG. 13, even when a plurality of light emitting apparatuses 10 are arranged such that the light emitting panels 20 are adjacent to each other, the array pitch of the light emitting element group Gmn between the light emitting apparatuses 10 becomes "D". As a result, it is possible to freely combine the light emitting apparatus 10 and widen applications of the light emitting apparatus 10 or improve expressiveness.

The light emitting panel 20 according to this embodiment has four circular notches 200. For this reason, as illustrated in FIG. 13, in a case where a plurality of light emitting apparatuses 10 are arranged such that the light emitting panels 20 are adjacent to each other, it is possible to fix each light emitting apparatus 10 to a target object using a washer by inserting a screw 500 into an opening formed by the notch 200 or the hemispherical notch.

According to this embodiment, the light emitting elements 30R, 30G, and 30B are connected using the twenty-four individual line pattern G1 to G8, R1 to R8, and B1 to B8 and the common line pattern CM formed in a mesh pattern shape. The mesh pattern is formed of a thin metal film with a line width of approximately 5 μm. For this reason, it is possible to sufficiently secure the transmissive property and flexibility of the light emitting apparatus 10.

According to this embodiment, out of the set of substrates 21 and 22, the conductor layer 23 consisting of the conductor patterns 23a to 23h is formed on the upper surface of the substrate 21. For this reason, the light emitting apparatus 10 according to this embodiment is thinned, compared to a light emitting apparatus with a conductor layer formed on both the upper side and lower side of the light emitting elements 30R, 30G, and 30B. As a result, it is possible to improve the flexibility and transmissive property of the light emitting apparatus 10.

According to this embodiment, a sum W1 of the widths (lengths of the X-axis direction) of the twenty-four individual line patterns G1 to G8, R1 to R8, and B1 to B8 of the conductor patterns 23a to 23h can be expressed as the following Formula (1), where "P" denotes an array pitch of the lines Lx and Ly, "M" denotes the number of the light emitting element groups, and "N" denotes the number of the light emitting elements included in the light emitting element group. In addition, a sum W2 of the widths (lengths of the X-axis direction) of the common line pattern CM can be expressed as the following Formula (2).

$$W1 \geq (P \cdot \cos\theta + P \cdot \sin\theta) \times 2 \times M \times N \tag{1}$$

$$W2 \geq (P \cdot \cos\theta + P \cdot \sin\theta) \times (M+1) \tag{2}$$

For example, assuming that the pitch P is set to "0.15 mm", θ is set to "450", M is set to "8", and N is set to "3", the sum W1 becomes 10.1823 mm, and the sum W2 becomes 1.9092 mm.

For this reason, the minimum width of the conductor patterns 23a to 23h having the "M" light emitting element groups becomes a sum Wa of the sums W1 and W2 (12.0915 mm). Therefore, the array pitch D of the light emitting element group Gmn is determined by a value of the sum Wa.

According to this embodiment, as shown in Formulas (1) and (2), if the number of the light emitting element groups connected to each conductor patterns 23a to 23h or the number of the light emitting elements included in the light emitting element group increases, the width of each conductor pattern 23a to 23h increases, and so the array pitch of the light emitting element group of the X-axis direction increases. In this case, by increasing the size of the Y-axis direction of each conductor pattern 23a to 23h, it is possible to equalize the array pitches of the X-axis direction and the Y-axis direction of the light emitting element group.

Figure 14:
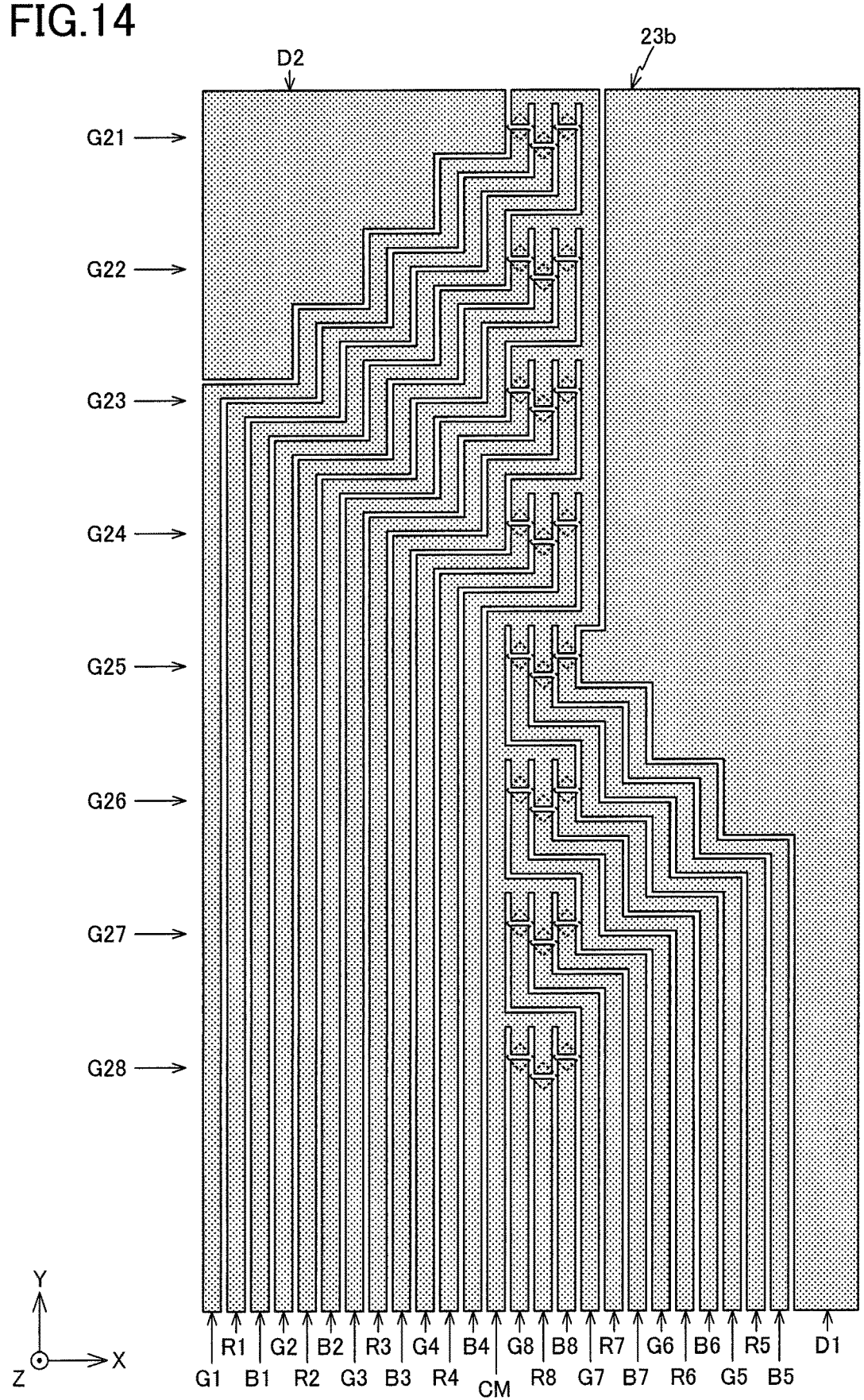
FIG. 14 is a diagram illustrating a modification of the conductor pattern.

While the embodiments of this disclosure have been described hereinbefore, this disclosure is not limited by such embodiments. For example, in the aforementioned embodiment, a case has been described wherein the −Y-side end of the common line pattern CM is arranged in one side (+X-side) of the twenty-four individual line patterns G1 to G8, R1 to R8, and B1 to B8 as illustrated in FIG. 5. Without limiting thereto, the −Y-side end of the common line pattern CM may be interposed in any gap between the twenty-four individual line patterns G1 to G8, R1 to R8, and B1 to B8 as illustrated in FIG. 14.

In the aforementioned embodiment, a case where the resin layer 24 is formed from the resin sheets 241 and 242 having a thermosetting property has been described. Without limiting thereto, the resin layer 24 may be formed from a thermoplastic resin sheet. In addition, the resin layer 24 may be formed from both a thermosetting resin sheet and a thermoplastic resin sheet.

In the aforementioned embodiment, a case where the conductor layer 23 is formed of a metal material such as copper (Cu) or silver (Ag) has been described. Without limiting thereto, the conductor layer 23 may be formed of a transparent material having conductivity such as indium tin oxide (ITO).

In the aforementioned embodiment, a case has been described wherein the light emitting apparatus 10 has light emitting element groups Gmn arranged in a matrix shape of eight rows and eight columns as illustrated in FIG. 1. Without limiting thereto, the light emitting apparatus 10 may have light emitting element groups Gmn arranged in a matrix shape of nine or more rows or eight or more columns.

In the aforementioned embodiment, a case has been described wherein three light emitting elements 30R, 30G, and 30B are arranged in an L-shape as illustrated in FIG. 2. The arrangement of the light emitting elements is not limited thereto. For example, the three light emitting elements 30R, 30G, and 30B may be arranged in a straight line or simply closely.

In the aforementioned embodiment, a case has been described wherein the light emitting elements 30G and 30B are adjacent to the light emitting element 30R. The arrangement sequence of the light emitting elements 30 is not limited thereto. For example, another light emitting element 30 may also be adjacent to the light emitting element 30G or 30B.

Figure 15:
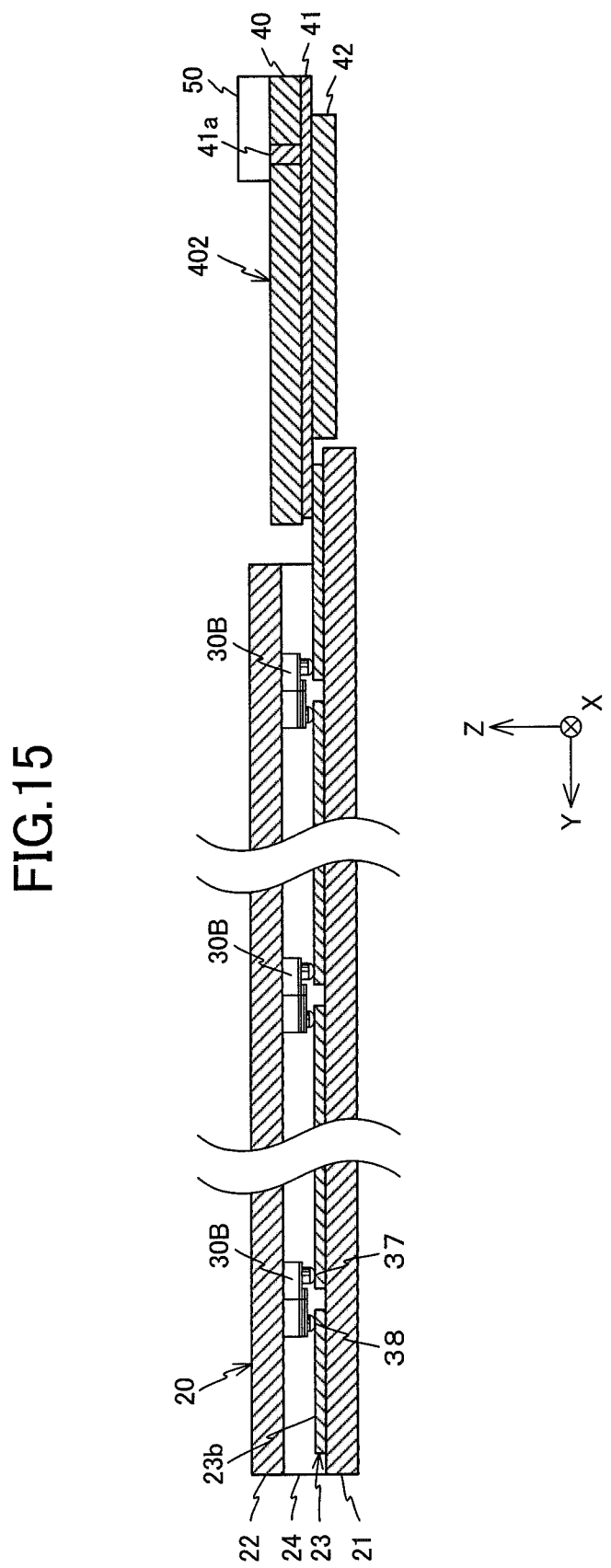
FIG. 15 is a cross-sectional view taken along a line A-A of the light emitting apparatus.

In the light emitting apparatus 10 configured as described above, for example, a connector 50 is mounted to the flexible cable 402 as illustrated in FIG. 15. Each terminal of the connector 50 is connected to the conductor pattern 41 through a via-hole 41a. The light emitting apparatus 10 is connected to an external device using the connector 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A light emitting apparatus comprising:
   first and second substrates having a light transmissive properties and flexibility arranged to face each other
   a plurality of light emitting element groups arranged along a first straight line between the first and second substrates and including a first light emitting element emitting a first color and a second light emitting element emitting a second color; and
   a plurality of conductor patterns arranged on the first substrate along a second straight line perpendicular to the first straight line and including respective individual light patterns individually connected to the first and second light emitting elements and a common line pattern commonly connected to the first and second light emitting elements,
   wherein the individual light patterns are routed to one side and the other side of the first straight line centered on at least a part of the common line pattern, wherein
   an array pitch of the plurality of light emitting groups in a direction of the first straight line is identical to an array pitch of the plurality of light emitting element groups in a direction of the second straight line, and
   a distance between an outer edge of the first or second substrates, and the light emitting element group closest to the outer edge is a half of the array pitch, and wherein
   a fan-shaped notch is provided in a corner portion of the first or second substrate.

2. The light emitting apparatus according to claim 1, wherein
   each of the plurality of light emitting element groups includes a third light emitting element;
   the common line pattern is commonly connected to the first light emitting element, the second light emitting element, and the third light emitting element;
   the conductor pattern includes individual line patterns respectively connected to the third light emitting elements.

3. The light emitting apparatus according to claim 2, wherein
   the first light emitting element emits red light,
   the second light emitting element emits green light, and
   the third light emitting element emits blue light.

4. The light emitting apparatus according to claim 1, wherein
   each of the plurality of individual line patterns of each of the conductor patterns has one end connected to any one of the first and second light emitting elements and the other end arranged in one side or the other side of the common line pattern.

5. The light emitting apparatus according to claim 2, wherein
   each of the plurality of individual line patterns of each of the conductor patterns has one end connected to any one of the first, second, and third light emitting elements and the other end arranged in one side or the other side of the common line pattern.

6. The light emitting apparatus according to claim 1, wherein
   the common line pattern is provided commonly to the plurality of the light emitting element groups, and distances between adjacent light emitting element groups are equal to each other.

7. The light emitting apparatus according to claim 1, wherein
   the plurality of individual line patterns and the common line pattern are mesh patterns.

8. The light emitting apparatus according to claim 1, wherein the individual line pattern is adjacent to the common line pattern between the neighboring conductor patterns.

9. A light emitting apparatus comprising:
first and second substrates having a light transmissive property and flexibility arranged to face each other;
a plurality of light emitting element groups arranged along a predetermined straight line between the first and second substrates and each of the plurality of light emitting element groups includes a first light emitting element emitting a first color and a second light emitting element emitting a second color; and
a conductor pattern formed on the first substrate and including respective individual light patterns individually connected to the first and second light emitting elements and a common line pattern commonly connected to the first and second light emitting elements,
wherein the individual line patterns are routed to one side and the other side of the straight line centered on at least a part of the common line pattern,
wherein the plurality of individual line patterns and the common line pattern are mesh patterns, and wherein
the mesh pattern includes a plurality of lines inclined by an angle θ relative to the first or second straight line, and
the individual line pattern has a width W1 expressed as follows:

"$W1 \geq (P \cdot \cos\theta + P \cdot \sin\theta) \times 2 \times M \times N$", where "P" denotes the array pitch of the line, "M" denotes the number of the light emitting element groups, and "N" denotes the number of the light emitting elements included in the light emitting element groups.

10. The light emitting apparatus according to claim 9, wherein
each of the plurality of light emitting element groups includes a third light emitting element;
the common line pattern is commonly connected to the first light emitting element, the second light emitting element, and the third light emitting element;
the conductor pattern includes individual line patterns respectively connected to the third light emitting elements.

11. The light emitting apparatus according to claim 10, wherein
the first light emitting element emits red light,
the second light emitting element emits green light, and
the third light emitting element emits blue light.

12. The light emitting apparatus according to claim 9, wherein
each of the plurality of individual line patterns has one end connected to any one of the first and second light emitting elements and the other end arranged in one side or the other side of the common line pattern.

13. The light emitting apparatus according to claim 10, wherein
each of the plurality of individual line patterns has one end connected to any one of the first, second, and third light emitting elements and the other end arranged in one side or the other side of the common line pattern.

14. The light emitting apparatus according to claim 9, wherein the common line pattern is provided commonly to the plurality of the light emitting element groups, and distances between adjacent light emitting element groups are equal to each other.

15. The light emitting apparatus according to claim 9, wherein
the common line pattern and the individual line patterns have a pad to which any one of the electrodes of the first, second, and third light emitting elements is connected.

16. The light emitting apparatus according to claim 9, wherein
a sum W2 of the widths of the common line patterns is expressed as:

"$W2 \geq (P \cdot \cos\theta + P \cdot \sin\theta) \times (M+1)$".

* * * * *